United States Patent
Perlov et al.

(10) Patent No.: US 11,868,022 B2
(45) Date of Patent: *Jan. 9, 2024

(54) METHOD FOR MANUFACTURING OF PATTERNED $SRB_4BO_7$ AND $PBB_4O_7$ CRYSTALS

(71) Applicant: IPG PHOTONICS CORPORATION, Oxford, MA (US)

(72) Inventors: Dan Perlov, Oxford, MA (US); Alexander Zaytsev, Oxford, MA (US); Anatolii Zamkov, Oxford, MA (US); Nikita Radionov, Oxford, MA (US); Aleksandr Cherepakhin, Oxford, MA (US); Nikolay Evtikhiev, Oxford, MA (US); Andrey Sadovskiy, Oxford, MA (US)

(73) Assignee: IPG PHOTONICS CORPORATION, Marlborough, MA (US)

( * ) Notice: Subject to any disclaimer, the term of this patent is extended or adjusted under 35 U.S.C. 154(b) by 78 days.

This patent is subject to a terminal disclaimer.

(21) Appl. No.: 17/415,211

(22) PCT Filed: Dec. 16, 2019

(86) PCT No.: PCT/US2019/066439
§ 371 (c)(1),
(2) Date: Jun. 17, 2021

(87) PCT Pub. No.: WO2020/131652
PCT Pub. Date: Jun. 25, 2020

(65) Prior Publication Data
US 2022/0066284 A1 Mar. 3, 2022

Related U.S. Application Data

(60) Provisional application No. 62/781,371, filed on Dec. 18, 2018.

(51) Int. Cl.
*G02F 1/355* (2006.01)
*G02F 1/35* (2006.01)
(Continued)

(52) U.S. Cl.
CPC ............ *G02F 1/3551* (2013.01); *C30B 29/22* (2013.01); *C30B 33/00* (2013.01); *G02F 1/354* (2021.01); *G02F 1/3548* (2021.01); *H01S 3/109* (2013.01)

(58) Field of Classification Search
CPC ........ G02F 1/3501; G02F 1/353; G02F 1/354; G02F 1/355; G02F 1/3551; G02F 1/3558;
(Continued)

(56) References Cited

U.S. PATENT DOCUMENTS 9,715,160 B2 * 7/2017 Pan ..................... C30B 15/00
2014/0362880 A1 * 12/2014 Chuang ................ G02F 1/3558
372/22

(Continued)

OTHER PUBLICATIONS

Aleksandrovsky et al., "Deep UV generation and fs pulses characterization using strontium tetraborate", May 18, 2011, Proc. SPIE 8071, Nonlinear Optics and Applications V, 80710K, 9 pgs. (Year: 2011).*

(Continued)

*Primary Examiner* — Daniel Petkovsek
(74) *Attorney, Agent, or Firm* — Yuri B. Kateshov, Esq.

(57) ABSTRACT

An $SrB_4O_7$ or $PbB_4O_7$ crystal is configured with a plurality of domains with respective periodically alternating polarity of the crystal axis so that the disclosed crystal is capable of quasi-phasematching (QPM). The disclosed crystal is manufactured by a method including patterning a surface of a crystal block of SrB4O7 or PbB4O7, thereby providing patterned uniformly dimensioned regions with a uniform polarity sign on the surface. The method further includes generating a disturbance on the patterned surface, thereby (Continued)

inverting a sign of crystal polarity of every other region to form the $SrB_4O_7$ or $SrB_4O_7$ crystal with a plurality of domains with alternating polarity enabling a QPM mechanism.

11 Claims, 6 Drawing Sheets

(51) Int. Cl.
  *C30B 29/22* (2006.01)
  *C30B 33/00* (2006.01)
  *H01S 3/109* (2006.01)
(58) Field of Classification Search
  CPC . G02F 1/37; G02F 1/3775; G02F 1/39; H01S 3/0092; H01S 3/109; H01S 3/11; H01S 3/2308
  See application file for complete search history.

(56) References Cited

U.S. PATENT DOCUMENTS

2018/0034227 A1* 2/2018 Trull-Silvestre ...... H01S 3/0014
2022/0066283 A1* 3/2022 Gapontsev ............. G02F 1/354

OTHER PUBLICATIONS

Aleksandrovsky et al., "Observation of spontaneously grown domain structure in SBO crystals via nonlinear diffraction", Apr. 4, 2007, Proc. SPIE 6610, Laser Optics 2006: Solid State Laser and Nonlinear Frequency Conversion, 66100V, 6 pgs. (Year: 2007).*
Yasunori Tanaka et al., "Kyropoulos growth of a 300 g SrB407 single crystal using a twin-type stirring blade", Japanese Journal of Applied Physics, vol. 61, Jun. 21, 2022, pp. 075503.
Aleksandr S. Aleksandrovsky et al., "Applications of Random Nonlinear Photonic Crystals Based on Strontium Tetraborate", Crystals, 2012, vol. 2, pp. 1393-1409.
Petra Becker., "Borate Materials in Nonlinear Optics", Advanced Materials, 1996. vol. 10:13, pp. 979-992.
Kensaku Maeda et al., "Fabrication of Quasi-Phase-Matching Structure during Paraelectric Borate Crystal Growth", Applied Physics Express, vol. 6, 2013, pp. 015501.
V.V. Atuchin et al., "Electronic structure of α-SrB407:experiment and theory", Journal of Physics: Condensed Matter, vol. 25, 2013, pp. 085503.
A.I. Zaitsev et al., "Morphology of the polar twin structure in Czochralski grown α-SrB407 crystals", Journal of Crystal Growth, vol. 416, 2015, pp. 17-20.
P.A. Popav et al., "Heat Conductivity and Thermal Expansion of Crystal Strontium Tetraborate α-SrB407", Doklady Physics. vol. 57(2): pp. 54-56.
Yu S. Oseledchik et al., "New nonlinear optical crystals: strontium and lead tetraborates", Optical Materials 4, 1994, pp. 669-674.
A.I. Zaitsev et al., "Nonlinear Optical, Piezoelectric, and Acoustic Properties of SrB407", Inorganic Materials, 2006, vol. 42(12), pp. 1360-1362.
V. Petrov et al., "Application on the nonlinear crystal SrB407 for ultrafast diagnostics converting to wavelengths as short as 125 nm", Optic Letters, Feb. 15, 2004: vol. 29(4): pp. 373-375.
Y. Tanaka et al., "Growth of high-quality transparent SrB407 single crystals with high degradation resistance for DUV laser applications", Applied Physics Express 11, 2018, p. 125501.
V.I. Zinenko et al., "Vibrational Spectra and Elastic Piezoelectric and Polarization Properties of the α-SrB407 Crystal", Journal of Experimental and Theoretical Physics, 2012, vol. 115(3): pp. 455-461.

* cited by examiner

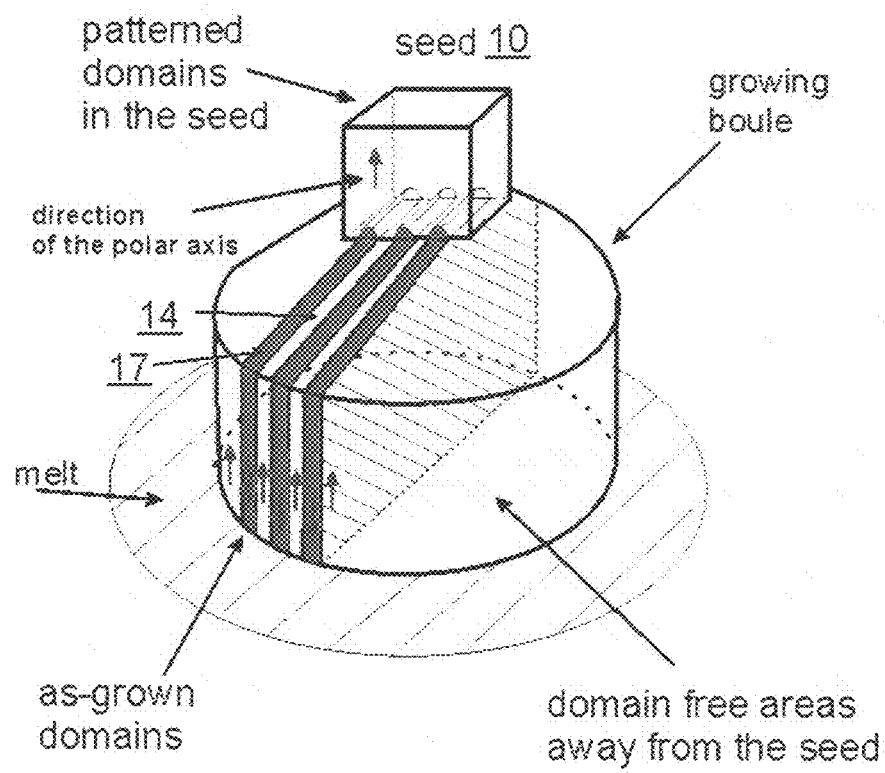

METHOD FOR MANUFACTURING OF PATTERNED SRB$_4$BO$_7$ AND PBB$_4$O$_7$ CRYSTALS

BACKGROUND OF THE DISCLOSURE

Field of the Disclosure

The disclosure relates to a strontium tetraborate (SrB$_4$O$_7$ or SBO) and lead tetraborate (PbB$_4$O$_7$ or PBO) crystals possessing a volume periodic domain/twin structure with alternate polarity, method of manufacturing these crystals and a high power solid state laser incorporating the inventive crystals.

Background of the Disclosure

The lasers have played a key role for the development of much technological advancement. The demand for laser tools in the ultraviolet (UV) including both a visible UV (VIS) range and particularly high power deep UV (DUV) range, and is growing enormously to address the needs experienced by material processing industry, medicine, data storage, optical communication, entertainment and others. Advances in semiconductor photolithogaphy, micromachining and material-processing applications, for example, are driving demand for coherent light sources operating in UV and DUV spectral regions.

Some gas lasers, such as excimer lasers can emit isolated wavelengths of coherent light in the UV and DUV spectral regions with a high average output power. However, compact solid-state lasers utilizing conversion of near 1 micron (μm) radiation by means of nonlinear optical (NLO) crystals can provide much more efficiency and flexibility. The performance of solid-state lasers in the UV and DUV spectral regions depends mostly on advances in growth and fabrication of efficient and reliable non-linear optical (NLO) crystals discovered over the last two decades.

For a reliable laser frequency conversion, NLO crystals with the following properties are desired: large NLO coefficient ($d_{eff}$), wide transparency at the wavelength of interest, sufficiently high birefringence enabling phase matching, small walk-off effect, large angular, spectral and temperature bandwidth, high laser-induced damage threshold, ease of growth and substantial size of as-grown bottle, low material cost, good chemical stability. In general, ability to withstand higher power density, longer crystal length, and larger nonlinear coefficients will result in higher conversion efficiency into UV. However, in practice there are always some limitations associated with nonlinear crystals.

Borate-based NLO crystals, such as β-barium borate (BBO), lithium triborate (LBO) and cesium lithium borate (CLBO), have long been recognized as a very important family of NLO materials and have been widely used for the laser frequency conversion. A borate NLO crystal should have a relatively short UV absorption cut-off ($\lambda_{cutoff}$) or wide energy bandgap ($E_g$) to guarantee the transmittance in the UV and DIN spectra. Moreover, the large bandgap significantly decreases the two-photon absorption or multi-photon absorption, and thus in turn increases the laser-induced damage threshold in a crystal and results in reduced non-desirable thermo-optical effects. Linear absorption of borates is typically very low as well.

Borates possess reasonably high non-linearity and in some cases moderate birefringence allowing for phase-matching through VIS-UV range. However, typically borates have quite low thermal conductivity which is a significant drawback for a high power laser application. Furthermore, most of borate-based NLOs, such as BBO and LBO, are either hydroscopic (BBO, LBO) or severely hydroscopic (CLBO), which makes handling these crystals quite difficult.

There is a group of borates including, for example, SBO/PBO that stands out on its own. It has some remarkable properties. First, it has a uniquely large (even among borates) bandgap of ~9 eV and its UV cut-off is about 130 nm. Based on our experimental data, SBO crystals have very low absorption at 1064 and 532 nm, only a few ppm/cm (less than 10). It should be highly transparent in UV and DUV spectral ranges. It is mechanically stable and non-hydroscopic. It is easy to grow this crystal by conventional Czochralski technique.

In addition, SBO crystals have a very high (for borate) thermal conductivity of ~16 W/m*K. It is an order of magnitude higher than that of BBO and LBO. Last but not least, the SBO crystal is one of a very few NLO crystals (if not the only one) which does not have two-photon absorption at 266 nm (second harmonic of a 532 nm wavelength). Combined with unique optical transparency and high LIDT, the SBO is probably the only non-linear material capable of withstanding sustainable multi-watt operation (pulsed and CW) at 266 nm with fluencies typical for nonlinear conversion regimes (~100-100 MW/cm$^2$). It would be an ideal material for UV generation but one little thing makes it seemingly irrelevant—SBO crystals have very low birefringence. As a consequence, SBO (and PBO) do not phase match for any non-linear optical interaction.

A technique of quasi phase matching (QPM) based on the periodic crystal structure can be used in some material cases when bulk phase matching is not possible. QPM technique is designed to compensate for propagation of interacting waves in a non-linear material at different velocities due to material dispersion. In the absence of phase matching the interacting fundamental and harmonic waves beat against each other through the entire length of a NLO crystal because of the dispersion. As a result, a harmonic intensity varies sinusoidally, i.e., it is not accumulated as illustrated by curve C in FIG. 1. In other words, a small fraction of power is first transferred from the fundamental wave to the harmonic wave, which is desirable, but then the harmonic gives away the received power fraction back to the fundamental wave. The transfer of the power fraction is thus a periodic process with a half period P/2 equal to the coherent length Lc which is thus the distance over which the phase of interacting waves is flipped by a factor of π.

To prevent this Sisyphean task of bouncing the power back and forth, the phase of the harmonic polarization wave can be flipped by π at a point A of FIG. 1 where harmonic power is beginning to get transferred to the fundamental wave. As a consequence, power will continue to be coupled into the harmonic. This can be accomplished by flipping the sign of the crystal polarization within the same crystal. Maximum efficiency is obtained by changing the direction of crystal polarization every coherence length Lc—the distance over which the phases of respective fundamental and forced waves slip by a factor of 180°. The sign change thus effectively rephrases interaction between the waves which leads to continuous power transfer into the harmonic wave as shown by curve A of FIG. 1.

QPM technique is widely used in ferroelectric materials such as Lithium Niobate-family or KTP-family. There are some other rather exotic non-linear ferroelectrics, such as LaBGeO5, which have very limited use due to some technical limitations. In all these materials the periodic inversion of domains is created by external electric field in a process named poling. However, the maximum clear aperture (the light-gathering area of an optical system) of non-linear optical devices made from these materials does not exceed 0.5-1 mm at the wavelengths in visible and UV ranges. Note that domains in these materials have a typical size (coherent length) dictated by material dispersion. Typically, the coherent length is in a range of a few microns. In the poling process the walls (separated by the above mentioned small distance) should propagate into material at a depth of several millimeters in order to create device with a reasonable optical aperture. These walls must be exactly parallel to each other in order to create such a structure. Otherwise they would collapse.

Unfortunately, ferroelectric materials are known for the domain broadening phenomenon manifested by non-parallel walls. In the process of poling the ferroelectric domain walls are not exactly parallel limiting thus the size of the clear aperture of ferroelectric structures.

Although the SBO symmetry group (mm2) in principle supports ferroelectricity, this material, like most, if not all borates, is most likely non-ferroelectric. For a long time periodically poled structures in SBO were considered impossible. But attempts to form periodic structure in other non-ferroelectric materials were made. For example, it is known to directly bond physically altered individual thin plates. But the thickness of the individual bonded plates was much higher than needed, and the technique did not find any practical use.

A periodically patterned QPM structure was also realized in a non-ferroelectric lithium tetraborate ($Li_2B_4O_7$) crystal during its re-crystallization. Maeda et al., "Fabrication of QPM Structure During Para-electric Borate Crystal Growth", Applied Physics Express 6, 105101 (2013). The reported method was realized by a Pt wire heater melting a plate-like seed crystal while translating the wire relative to the seed first in one direction and then in the opposite direction.

Besides the complexity and low efficiency of the-above mentioned method, the fabricated crystal exhibits one fundamental problem. The minimal twin spacing, i.e., the width, of the crystal is reported to be of about 100 µm dictated by the smallest practical wire diameter. This is unacceptably high number for generating light in VIS and UV where the width of each domain should be 1-20 µm. To create these short periods in SBO or PBO with the direct wire melting, as taught in the above-mentioned paper, is not practical.

Periodic twining of quartz under the stress has been attempted in order to create a device capable to produce UV light. Low non-linearity of quartz and some technical limitations of the method did not produce any useful practical outcome.

A new practical approach to create a periodic structure in non-ferroelectric material is disclosed in U.S. Pat. No. 6,970,276. The latter teaches the growth of OP-GaAs (orientation patterned GaAs). The material is non-ferroelectric, yet polar (and non-linear). In order to create a periodic structure a special patterned seed is prepared. The periodic structure is grown then by HVPE method. These structures are used for light conversion in IR. Unfortunately, this class of materials is not transparent even in a visible spectral range, let alone a UV range. And SBO (or other borate) material will not grow from the vapor phase by this or any similar method. It is also impossible to create a periodically patterned seed of SBO by the approach disclosed. Furthermore, the domain walls in OP-GaAs do not grow exactly parallel in this approach limiting the optical aperture of thus grown devices.

As described above, the dimensions of the clear aperture in periodically inverted crystals is limited to about 0.5-1 mm at the wavelength of interest. This relatively small clear aperture requires a tight beam focusing at the fundamental wavelength not exceeding 100 µm and smaller which can be obtained with a great degree of difficulty using sophisticated beam guiding optics. Based on the above-discussed and other prior art sources, it is not surprising that as low as about 1 W pulsed (or CW) output at around a 266 nm wavelength becomes problematic while current demands require tens of watts. Note that at wavelengths shorter than 200 nm, a mW output is considered to be very good. However, many applications associated in a DUV range are in dire need for much higher power outputs.

It is generally known that under certain conditions in some crystals the domains of opposite polarity exist. Unfortunately, they are spontaneous, random and not-patterned, thus useless for any practical application.

If a periodic structure with ideally parallel walls was created in the SBO specifically, it would open numerous possibilities in high power UV all solid state laser applications at 266 nm and down to under 200 nm. It is also noteworthy that the periodic structure can be utilized also in cousto-optics and some other applications.

Based on the foregoing, a need exists for a SBO/PBO crystal fabricated with a periodic structure of polarity-alternating domains enabling a QPM mechanism.

Another need exists for the above-mentioned SBO/PBO crystal with the walls of respective uniform parallel domains dimensioned with a domain spacing of 1 to 20 µm and having respective walls which deviate from one another at less than 1 micron over a 10 mm-long distance.

Still another need exists for the above-mentioned SBO/PBO crystal having the clear aperture exceeding 1 mm and preferably greater than 5 mm clear while operating in a VIS-UV-DUV spectral range.

Another need exists for a method of manufacturing the above described SBO crystal.

Still another need exists for a solid state laser having a nonlinear frequency converter with the above-mentioned SBO crystal and generating an output from single watts to a few hundred watt-power range in the VIS-DUV spectral range.

SUMMARY OF THE DISCLOSURE

In accordance with one aspect of the disclosure, the inventive SBO and PBO crystal is configured with a plurality of domains which have highly parallel walls deviating from one another at less than 1 micron over 10 mm distance. The domains are fabricated with respective periodically alternating polarity of the crystal axis which enables a QPM mechanism.

In accordance with one feature of the inventive subject matter, the disclosed SrB4O7 or PbB4O7 crystal is utilized as a nonlinear optical element with a QCW scheme used for converting a fundamental frequency to a higher harmonic which is selected from the group consisting of a second harmonic, third harmonic generation, higher harmonic generations and optical parametric interactions.

In accordance with a further feature, the inventive SrB4O7 or PbB4O7 crystal is used as a seed for growing larger size SrB4O7 or PbB4O7 nonlinear crystals.

The disclosed SrB4O7 or PbB4O7 nonlinear crystal features the domains each provided with a thickness between 0.2 μm and about 20 μm and a clear aperture which has a dimeter varying from about 1 mm to about 5 cm. The disclosed SBO/PBO crystal of the first aspect can be characterized by all of the above-disclosed feature or any combination of the features and any individual feature.

In accordance with a further aspect of the disclosure, the inventive method of fabricating the SBO/PBO crystal with a periodic structure includes patterning a surface of a crystal block of SBO/PBO, thereby providing a plurality of alternating protected and unprotected uniformly dimensioned regions with a uniform polarity sign on the surface. Thereafter, the method includes generating a disturbance on the patterned surface, thereby inverting a sign of crystal polarity of every other region such as to provide the SBO/PBO crystal provided a plurality of domains with an alternating polarity and capable of QPM.

According to one feature of the disclosed method, prior to the patterning step, a layer of photoresist to the surfaces is applied. Then a mask with the desired period is applied atop the layer of photoresist so as to provide a plurality of regions with exposed photoresist and covered photoresist which alternate one another with subsequent removal of the photoresist layer off the regions with exposed photoresist. As a result, patterned surface is characterized by protected and unprotected regions which alternate one another.

According to another feature, the patterning step includes metallizing the patterned surface or surfaces and subsequently applying a layer photoresist atop the metallized surface(s). Thereafter, a mask with the desired period is applied atop the layer of photoresist so as to provide a plurality of regions with exposed photoresist and covered photoresist which alternate one another. Finally, the photoresist layer and metal in the regions with the exposed photoresist are removed which leads to the formations of patterned regions.

According to a further feature of the method of the second aspect, the step of generating disturbance includes initially structuring the patterned surface with protected and unprotected regions of the crystal block, thereby providing a formation on every other region. This is followed by a step of creating a surface profile, such as grooves or areas with modified properties or formations. The method in accordance with this feature proceeds with generating an internal disturbance at the structured surface of the crystal block. One of probably unique methods would be Czochralski method of growing the structured crystal generating the disturbance at the interface of as-growing crystal. As a result, the $SrB_4O_7/SrB_4O_7$ crystal with a plurality of domains with alternating polarity corresponding to patterned regions is grown.

Alternatively, the step of generating the disturbance in accordance with still another feature includes structuring the patterned surface which has the protected and unprotected regions. Thereafter the surface pattern is created including formation at every other region. Then, the method in accordance with this feature proceeds with applying an externally generated disturbance to the structured patterned surface, thereby flipping the polarity of every other region. Finally, the step of growing the $SrB_4O_7$ or $SrB_4O_7$ crystal with a plurality of domains having alternating polarity completes this method step.

In accordance with the disclosed method, the disturbance can be generated by applying an external force to the protected regions of the patterned surface, flipping the domain polarity periodically. The $SrB_4O_7$ or $SrB_4O_7$ crystal in accordance with the inventive method may be used as a frequency converter in the laser system for generating a second harmonic generation, third harmonic generation, higher harmonic generations and optical parametric interactions. Alternatively, it may be used as a seed for fabricating the inventive crystal distinguished by a considerably larger size.

The disturbance may be generated utilizing a mechanical stress, thermal stress, electrical field, ion implantation, in-diffusion, UV-radiation, X-ray radiation or physical contact with a patterned face of secondary $SrB_4O_7$ or $SrB_4O_7$ crystal block. The regions provided on the patterned face of the crystal block have a required thickness for a VIS-UV-DUV light ranging between 0.5 m and about 20 μm.

BRIEF DESCRIPTION OF THE DRAWINGS

The above and other aspects and feature will become more readily apparent in conjunction with the following drawings, in which:

FIG. 6 illustrates growing an SBO/PBO crystal with the domain structure originated at the seeding.

SPECIFIC DESCRIPTION

Figure 1:
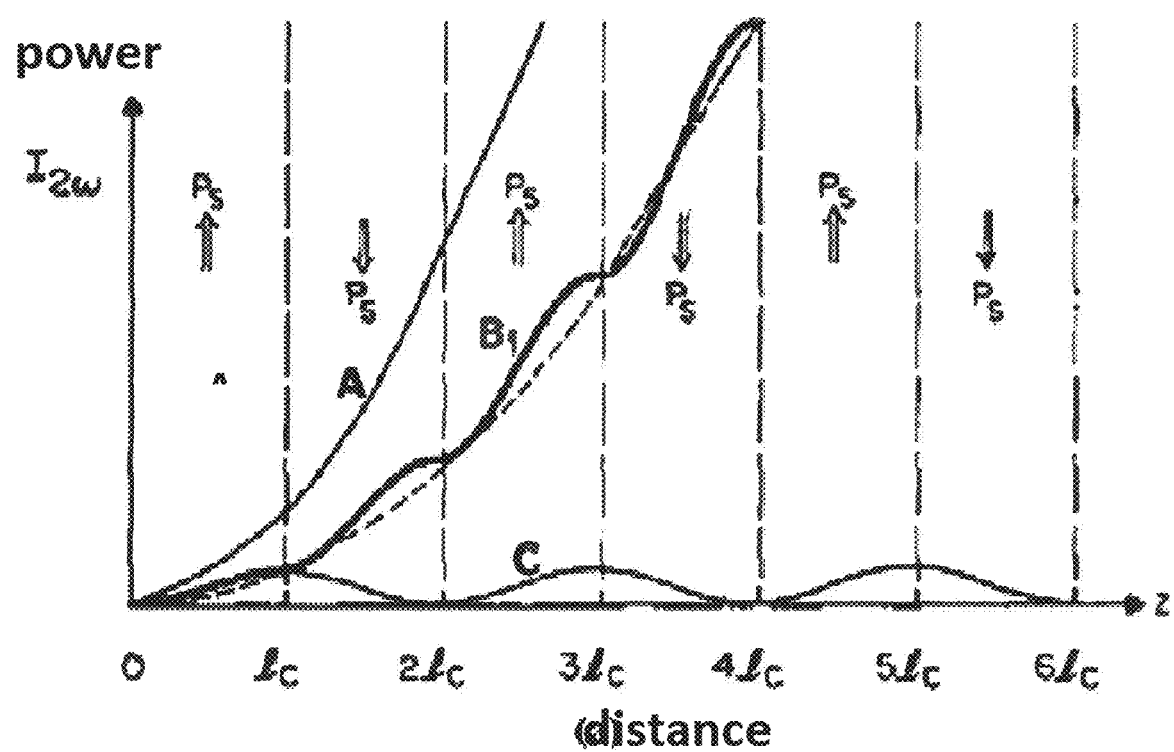
FIG. 1 is a graphical representation of the quasi-matching principle.

Reference will now be made in detail to the disclosed inventive concepts. Wherever possible, same or similar reference numerals are used in the drawings and the description to refer to the same or like parts or steps. The drawings are in simplified form being far from precise scale.

It generally known that the domain walls can be relatively planar/parallel, protruding seemingly without noticeable deflection. It can be suggested that SBO/PBO may be one of these materials. According to the data obtained by Applicants, this suggestion was verified by providing an SBO crystal with planar walls which protrude over a distance of at least several millimeters. In one of the experimental samples of the inventive SBO/PBO grown in accordance with the disclosed method, the deviation of protruding walls over a 10 mm distance did not exceed the detection limit (0.1 micron in that case). However, the data suggests that the deviation of twins in the disclosed crystal is less than one lattice period. As a consequence, indefinitely large apertures of QPM structures reaching several centimeters can be obtained in the inventive SBO/PBO utilizing the inventive method.

Figure 2:
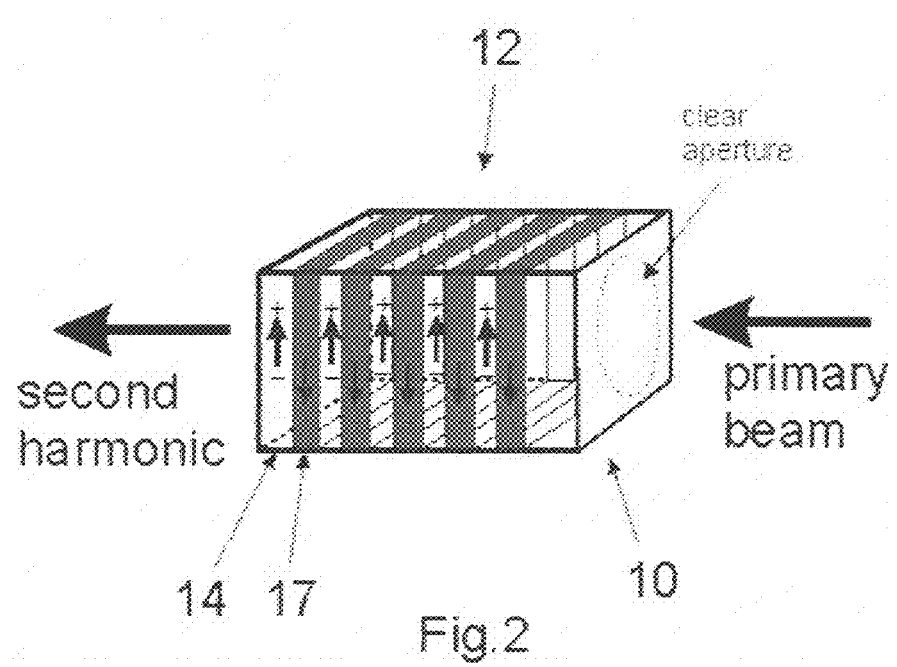
FIG. 2 is an elevated view of the inventive SBO and PBO crystals.

Referring to FIG. 2, inventive crystal SBO or PBO 10 is configured with a periodic structure 12 of domains 14 and 17 having respective opposite polarities +/− which alternate one another. These domains have highly parallel walls. The periodic structure 12 allows the use of a QPM technique to generate high harmonic wavelength of the fundamental wave which includes second harmonic generation, third and higher harmonic generation, and optical parametric interactions. Recent experiments conducted by the Applicants resulted in crystal 10 provided with a volume periodic pattern which includes a sequence of uniformly dimensioned 3D-domains 14, 17 having respective positive and negative polarities which alternate one another and provide the crystal with a clear aperture having a diameter of up to a few centimeters. The domains each are configured with a uniform thickness corresponding to the desired coherence length l and ranging from about 0.2 μm to about 20 μm. The crystal 10 can be utilized as an optical element, such as a frequency converter incorporated in a laser which operates in a variety of frequency ranges. For example, crystal 10, configured to convert frequency in a laser outputting radiation in a DUV frequency range, has a coherence length l ranging between 0.2 to about 5 nm. The volume pattern may extend through the entire thickness of crystal block 10 between faces +C and −C, or terminate at a distance from one of these faces.

FIGS. 3 and 4A-4D illustrate the inventive multi-step method. The initial stage 32 of FIG. 3 includes preparing a single monocrystal block SBO/PBO 10 of FIG. 4A in accordance with techniques well known to one of ordinary skill worker. The following stage is designed to provide one (or both) surfaces +C, −C, or any other polar surface with a surface periodic pattern having the desired period. This stage utilizes alternative techniques all resulting in a plurality of parallel, uniformly dimensioned adjacent regions 30, 32 (FIG. 4) which are formed, for example, on face +C and thus have the uniform polarity. However, the structure of every other region is different from the flanking regions. In other words, structurally regions 30 differ from regions 32. Several techniques can be utilized to realize such a configuration.

Figure 3:
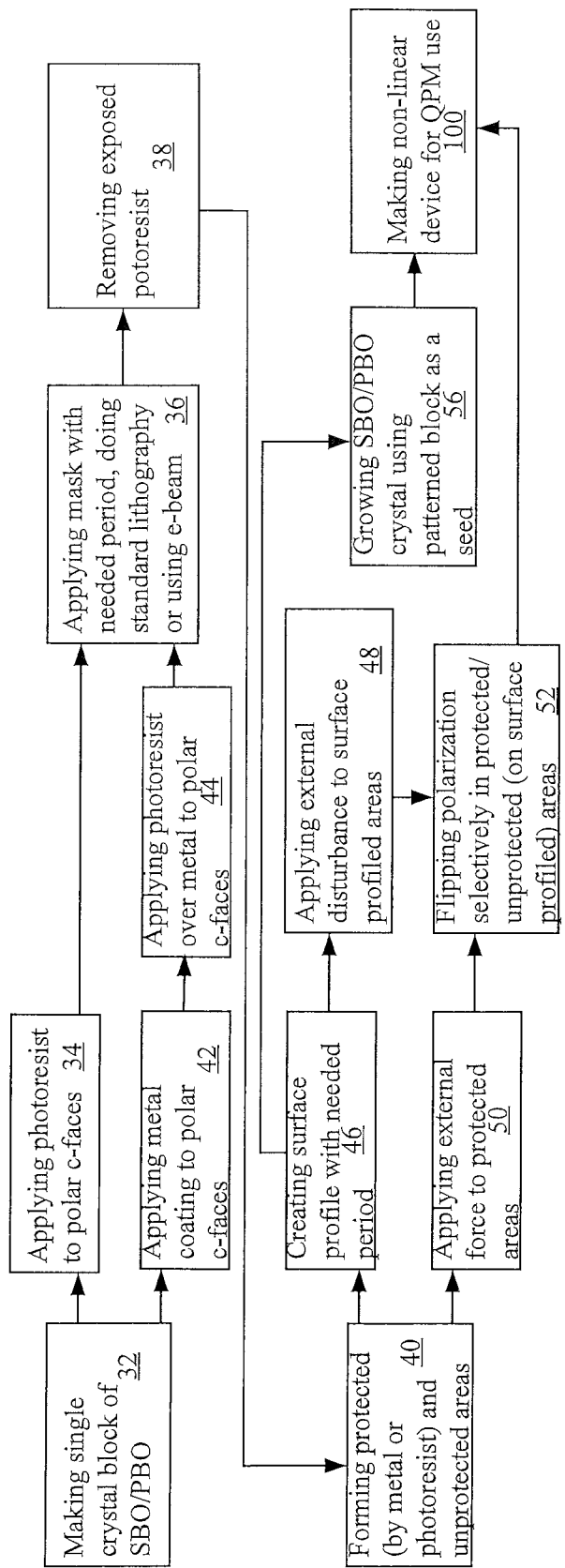
FIG. 3 is a flow diagram illustrating a preferred embodiment of the inventive method of fabricating the crystal of FIG. 2.

For example, one of the polar faces is provided with a photoresist layer, as shown in 34 of FIG. 3. Thereafter, using any of the known methods, such as standard lithography or e-beam, the mask with the desired period is applied upon the photoresist layer, as shown in 36 of FIG. 3. Thereafter, the photoresist layer is removed from the unprotected areas in step 38 leaving thus crystal block 10 of FIG. 4B with the surface pattern defined by alternating protected and unprotected regions 30, 32, as shown in step 40. As a result, the surface to be patterned includes a plurality of photoresist exposed and covered by the mask alternating areas.

Alternatively, the step 40 of providing protected/unprotected regions 30, 32 can be conducted by applying a metal coating to one of the polar faces in step 42. Thereafter, a photoresist layer is provided atop the metal coating in step 44. The steps 36 and 38, discussed above, follow to provide the structured polar face with protected and unprotected regions 30, 32 in step 40 as shown in FIG. 4B.

The following stage of the inventive method includes fabricating crystal 10 having a volume periodic pattern which includes domains 14 and 17 having different crystal polarity. There are several premises suggested and verified by Applicants that are critical to the manufacturing of crystal 10 of FIG. 4D which is structurally identical to FIG. 2. In accordance with one premise, any disturbance impacting regions 30 or 32 or the entire patterned face +C of crystal block 10 of FIG. 4C leads to the change of the polarity of the impacted regions. According to the second premise, the volume pattern to be formed from the surface pattern inherits all of the parameters of the surface pattern. In other words, the number of regions 30, 32 and each region's length and width remain unchanged as the volume pattern protrudes through the body of crystal 10 of FIG. 4D, but the polarity of every other region flips. Thus, regions 30, 32 of crystal 10 grow into respective domains 14, 17 extending toward the opposite crystal polar face −C with every other domain, for example 14, having the polarity flipped opposite to that of domains 17.

Referring specifically to step 46 of FIG. 3, the formation of the volume periodic pattern begins with profiling the surface of single crystal or crystal block 10 of FIG. 4B after the latter is patterned in step 40. Creating the surface profile with the desired period can be accomplished by a variety of techniques. For example, it is possible to apply a matrix with the desired pattern of formations of the same polarity to the patterned surface +C. The formation may include, for example, alternating with the desired period grooves and ridges which create respective indentations on the surface of crystal block 10. With crystal block 10 provided with formations structurally distinguishing regions 30, 32 from one another, alternative techniques for flipping the polarity of one group of regions 30, 32 can be implemented.

Figure 4:
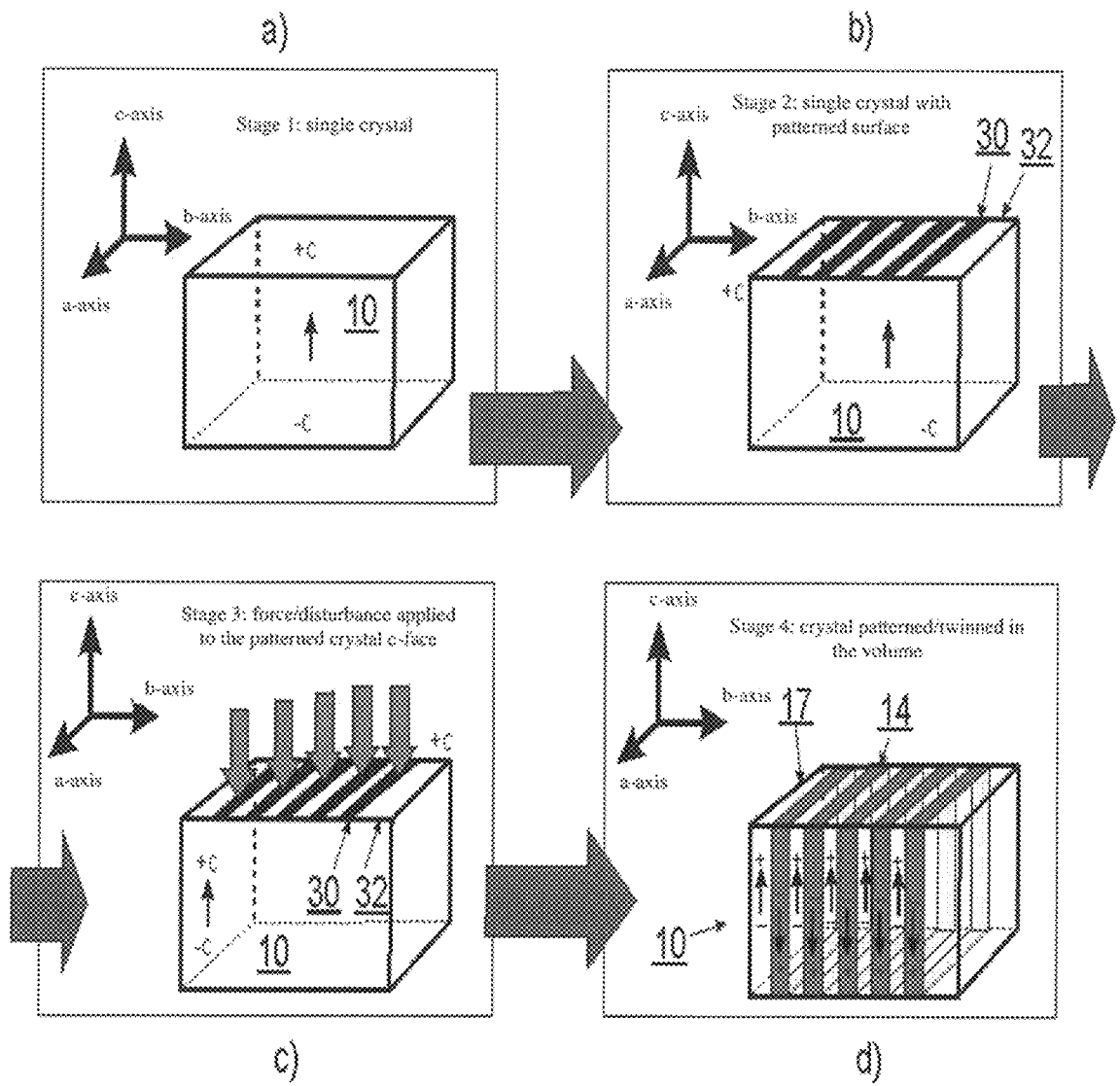
FIGS. 4A-4D are diagrammatic representation of selective steps of the inventive method.
Figure 5:
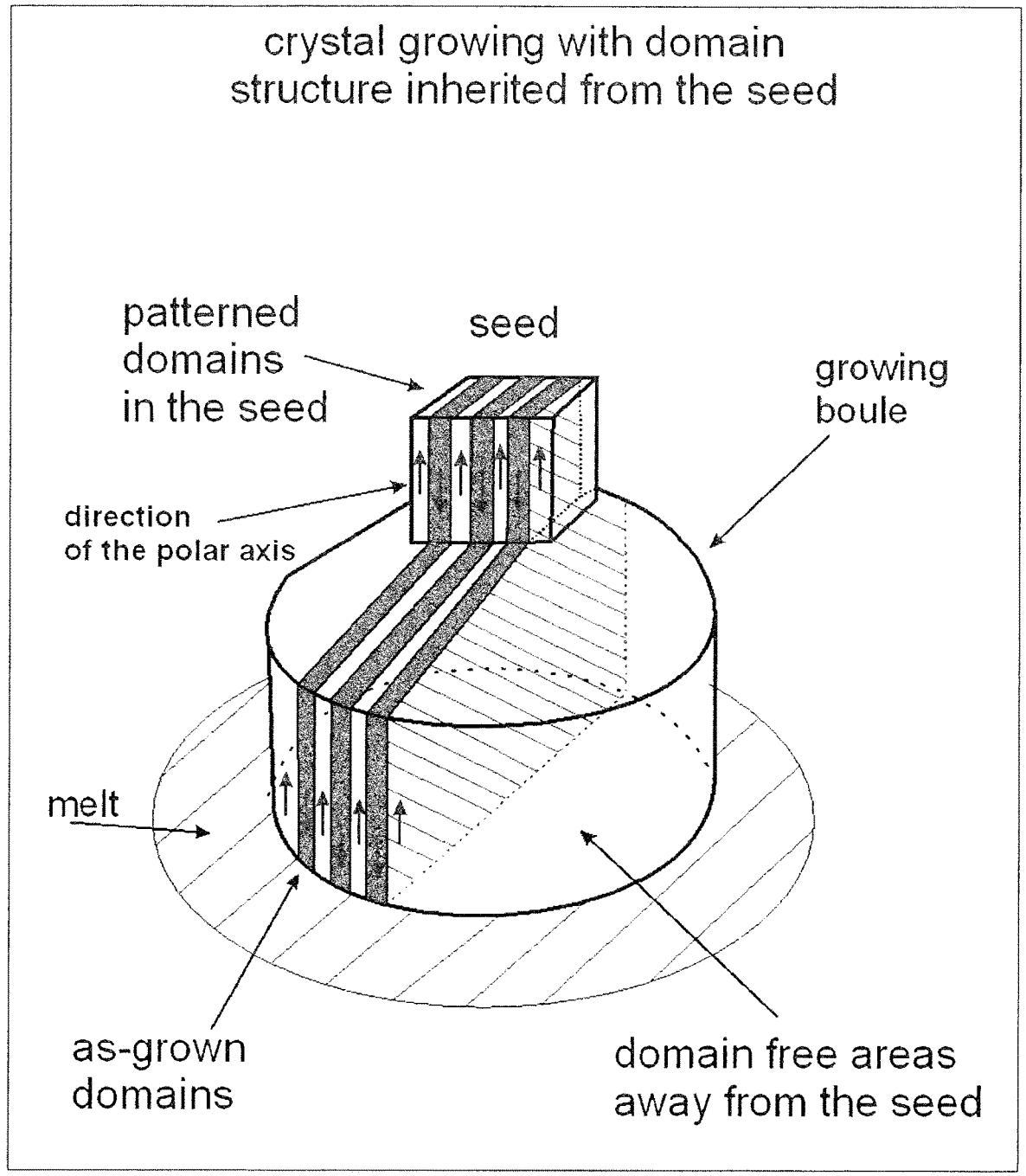
FIG. 5 illustrates growing an SBO/PBO crystal with the domain structure inherited from the seed of FIG. 2.

One of these technique provides for crystal block 10 with the profiled surface of step 46 to be used as a seed for growing large-size SBO/PBO crystal 10, as shown step 56 of FIG. 3 and FIGS. 4D and 5 by utilizing, for example, the Czochralski method. The latter is one of many high temperature crystal-growth methods from a melt. Other methods, such as Bridgeman, directional recrystallization, top-seeded solution growth etc, all are part of the disclosed subject matter. Turning to FIG. 4, regions 30 of crystal block 10 have respective formations, such as grooves of step 46. Due to the elevated temperatures associated with any temperature crystal-growth method, the formations may melt away. For that reason, the temperature at the interface between seed/crystal 10 and the boule should be controlled to be at or below the known melting temperature.

Importantly, however, that as the crystal-growth method continues, the seeding stress at the interface between seed 10 and growing boule (FIG. 6) flips the polarity of either regions 14 or regions 17 in the growing boule. As can be seen, seed 10 has pattern of regions 30, 32 with the same polarity, as indicated by uniformly facing arrows, but growing crystal 10 has the domains with respective opposite polarities. Once crystal 10 of step 56 is ready, it may be used as an optical element, such as frequency converter, in step 100. Alternatively, crystal 10 provided in step 56 can be further used as a seed for even larger crystals.

Alternatively, crystal 10 of step 46 with the profiled surface may be impacted by an externally generated disturbance in step 48 as illustrated in FIG. 4C. For example, it can be a stress produced mechanically, electrically, or utilizing ion implantation (or in-diffusion), UV or X-ray radiation by any well-known method of generating the stress. Regardless of the origin and nature of the disturbance, it provides flipping the polarity of one group of regions 30 or 32, as shown in step 52. As in the previously disclosed operation, crystal 10 may be used as an optical element of step 100 or used as the seed in step 56. But in contrast to the procedure disclosed immediately above, crystal block used in the Czochralski method has regions 30 and 32 having respective opposite polarities due to the external force applied previously. The growing boule inherits the structure of crystal block 10. This particular technique is illustrated in FIG. 5. Note that both techniques for flipping polarity as disclosed above start with profiling the patterned surface in step 46. Yet there is an alternative technique which is disclosed immediately below.

The crystal block of step 40 is immediately impacted by a force generated by an external source, as indicated in step 50 and illustrated in FIG. 6. The force affects either protected regions 30 or unprotected regions 32. The application of the external force continues until selective regions 30 or 32 have their initial polarity flipped, as indicated by step 52 and shown in FIG. 4D. Thus crystal block 10 of FIG. 4D is provided with domains 14, 17 having alternating polarity. Thereafter, crystal block 10 of FIG. 4D may be either used as a seed in step 56 and FIG. 4C, if the size of crystal 10 of FIG. 4D does not have the desired dimensions, or used as a ready to operate optical element of step 100. The Applicants demonstrated that such a patterned crystal produced from a seed in either approach disclosed above can grow in direction of polar axis c, non-polar axis a, any direction in between c and a, as well as in a direction close to a/c plane.

An experimental SBO crystal with a 5 cm clear aperture was recently grown utilizing the inventive method. This particular dimension provides unique favorable conditions for using large diameter laser beams at a pump wavelength incident on the selected crystal surface without costly beam guiding optics. The length of SBO crystal 10 along axis A, coinciding with a direction of beam propagation, is limited by the dimensions of the patterned seed, which can be extended in the b crystallographic direction (FIG. 4D) to make the corresponding area larger. In contrast to the known prior art, the walls of respective domains 14 and 17 are ideally parallel to one another.

The experimental crystals fabricated by any of the above disclosed method steps and incorporated in the lasers as the frequency converter demonstrated an output power at 266 nm ranging from 1 W to 10 W.

It is to be understood that while the invention has been described in conjunction with the detailed description thereof, the foregoing description is intended to illustrate and not limit the scope of the invention, which is defined by the scope of the appended claims. For example, while the disclosure is dedicated to providing a periodic structure having alternating domains of uniform width, it is perfectly possible to use the disclosed method to construct aperiodic structures or non-planar structures such as photonic crystals. Other aspects, advantages, and modifications are within the scope of the following claims.

The invention claimed is:

1. A strontium tetraborate ($SrB_4O_7$) or lead tetraborate ($PbB_4O_7$) crystal comprising a plurality of uniform domains with respective periodically alternating polarity of the crystal axis, the uniform domains defining a volume periodic structure of the $SrB_4O_7$ or $PbB_4O_7$ crystal enabling quasi phase-matching (QPM) use.

2. The $SrB_4O_7$ or $PbB_4O_7$ crystal of claim 1, wherein the crystal is configured to be a nonlinear optical element with the QPM used for converting a fundamental frequency to a higher harmonic which is selected from the group consisting of a second harmonic, third harmonic generation, higher harmonic generations and optical parametric interactions.

3. The $SrB_4O_7$ or $PbB_4O_7$ crystal of claim 1, wherein a thickness of each domain for a VIS-DUV light range is between 0.2 µm and about 20 µm.

4. The $SrB_4O_7$ or $PbB_4O_7$ crystal of claim 1, further having a clear aperture with a diameter which varies from about 1 mm to about 5 cm.

5. The $SrB_4O_7$ or $PbB_4O_7$ crystal of claim 1, wherein the uniform domains have parallel walls deviating from one another at less than 1 µm over a 10 mm distance.

6. A method of fabricating a periodic structure in a strontium tetraborate ($SrB_4O_7$) or lead tetraborate ($PbB_4O_7$) nonlinear crystal, comprising:
patterning a surface of a $SrB_4O_7$ or $PbB_4O_7$ block, thereby providing a plurality of alternating protected and unprotected uniformly dimensioned regions with a uniform polarity sign of the crystal axis;
generating a disturbance on the surface, thereby inverting a sign of crystal polarity of every other region such as to provide the $SrB_4O_7$ or $PbB_4O_7$ block with a periodic volume structure including a plurality of uniformly dimensioned domains with an alternating polarity of the crystal axis, thereby obtaining the $SrB_4O_7$ or $PbB_4O_7$ nonlinear crystal enabling quasi phase-matching (QPM).

7. The method of claim 6, wherein the patterning step includes:
metallizing the patterned surface,
applying a layer of photoresist atop the metallized surface,
applying a mask with a desired period atop the layer of photoresist, thereby providing a plurality of uniformly-dimensioned regions with exposed photoresist and covered photoresist which alternate one another, and
removing the photoresist layer and metal off the uniformly-dimensioned regions with exposed photoresist, thereby forming uniformly-dimensioned patterned regions.

8. The method of claim 6, wherein the step of generating disturbance includes:
generating an internal disturbance on the structured surface while utilizing a high temperature melt technique, thereby growing the $SrB_4O_7$ or $PbB_4O_7$ crystal with a plurality of uniformly-dimensioned domains which have alternating polarity corresponding to the polarity of respective uniformly-dimensioned regions, wherein the high temperature technique is selected from a Czochralski method, Bridgeman, directional recrystallization, or top-seeded solution growth.

9. The method of claim 6, wherein the step of generating disturbance on the surface includes applying an external force to the protected regions of the patterned surface, thereby flipping the polarity of every other region.

10. The method of claim 9 further comprising utilizing a high temperature melt technique, thereby growing the $SrB_4O_7$ or $PbB_4O_7$ crystal with a plurality of uniformly-dimensioned domains with alternating polarity corresponding to the polarity of respective uniformly-dimensioned regions, wherein the high temperature technique is selected from a Czochralski method, Bridgeman, directional recrystallization, or top-seeded solution growth.

11. The method of claim 6, wherein the domains of the volume periodic structure of the $SrB_4O_7$ or $SrB_4O_7$ nonlinear crystal have respective parallel walls which deviate from one another at less than 1 micron (µm) over a 10 mm distance.

* * * * *